United States Patent

[11] 3,619,187

[72] Inventor Edward Cerwonka
Binghamton, N.Y.

[21] Appl. No. 704,521
[22] Filed Feb. 12, 1968
[45] Patented Nov. 9, 1971
[73] Assignee GAF Corporation
New York, N.Y.

[54] PROCESS FOR PREPARING COLORED PHOTORESISTS
13 Claims, No Drawings

[52] U.S. Cl. .......... 96/35.1, 96/48, 96/115
[51] Int. Cl. .......... G03c 1/68
[50] Field of Search .......... 96/115 P, 35.1, 48

[56] References Cited

UNITED STATES PATENTS

| | | | |
|---|---|---|---|
| 3,101,270 | 8/1963 | Evans et al. | 96/115 |
| 3,183,094 | 5/1965 | Cerwonka et al. | 96/115 X |
| 3,352,675 | 11/1967 | Cerwonka | 96/35.1 |

*Primary Examiner*—Ronald H. Smith
*Attorneys*—Walter C. Kehm, Samson B. Leavitt, Walter G. Hensel, Homer G. Bridger and Martin A. Levitin

ABSTRACT: Photopolymerizable compositions containing a polymerizable ethylenically unsaturated compound, a ferric salt, a peroxy compound and an alpha-hydroxycarboxylic acid, and their use in preparing photoresists.

PROCESS FOR PREPARING COLORED PHOTORESISTS

This invention relates generally to the field of photography and more particularly, to a novel process for the preparation of colored photoresists involving the selective exposure of photopolymerizable coatings to light.

The preparation of photoresists from photopolymerizable coatings is well-known in the art. Generally speaking, a photopolymerizable coating comprises a polymerizable monomer, or a mixture of polymerizable monomers together with a light-sensitive polymerization initiator usually coated upon a suitable support. Upon exposure of the coating to light through an image-bearing transparency, the polymerizable monomer becomes relatively hard in those areas upon which light has impinged so that after washing away the unexposed portions, a photoresist is obtained.

A photopolymerizable coating which has been found to be particularly advantageous is one consisting of a water-soluble colloidal carrier, at least one ethylenically unsaturated monomer, i.e., a compound containing a $$CH_2{=}C\langle \text{ group,}$$

a ferric compound, and a peroxy compound. This photopolymerizable coating is particularly adapted to be employed in a variety of processes such as the production of the printing plates and other photographic and lithographic applications as the production of bimetallic printing plates, etched copper halftone images, grained zinc or aluminum lithographic plates, zincated lithographic plates, etc.

However, this photopolymerizable coating is not completely satisfactory in those applications where the color of the photoresist is an integral part of the operation.

It has now been found that the color of the photoresist can be varied so as to provide very pleasing patterns or designs. The instant invention finds particular use in the fields of decoration and ornamentation wherein it is now possible to produce intricate designs of a wide variety of colors in an accurate, efficient and dependable manner.

Therefore, it is the object of this invention to provide a novel process for the production of colored photoresists from photopolymerizable coatings comprising a water-soluble colloidal carrier, an ethylenically unsaturated monomer or monomers, a ferric compound, and a peroxy compound.

It has now been found that the above object can be attained by incorporating an alpha-hydroxy carboxylic acid into a photopolymerizable coating comprising a water-soluble colloidal carrier, an ethylenically unsaturated monomer or monomers, a ferric salt and a peroxy compound. The alpha-hydroxy carboxylic acid which is incorporated into the polymerizable coating can serve to produce colored photoresists in two different ways. In the first way, an alpha-hydroxy carboxylic acid can be chosen which is a color coupler so that it will provide color to a photoresist upon action with a conventional color developer. Alternatively, an alpha-hydroxy carboxylic acid can be chosen which is, in itself, a dyestuff, so that it would impart color to the photoresist directly.

It is to be immediately understood that this invention relates to a novel process for coloring photoresists and not to a specific polymerizable coating. Any normally liquid to solid photopolymerizable, ethylenically unsaturated monomer is applicable in the practice of this invention. Compounds particularly advantageous are the photopolymerizable vinyl or vinylidene compounds containing $$CH_2{=}C\langle \text{ group}$$

activated by direct attachment to a negative group such as halogen, $$\rangle C{=}O,$$

C≡N, C≡C, $NO_2$, or aryl. Examples of such photopolymerizable compounds include acrylamide, acrylonitrile, N-hydroxyethyl acrylamide, methacrylic acid, acrylic acid, calcium acrylate, methacrylamide, vinyl acetate, methylmethacrylate, methylacrylate, ethylacrylate, vinyl benzoate, vinyl pyrrolidone, vinylmethyl ether, vinylbutyl ether, vinylisopropyl ether, vinylisobutyl ether, vinylbutyrate, butadiene, vinyl chloroacetate, vinyl trimethylacetate, vinyl propionate, vinylidine chloride, etc., as well as the mixtures of these compounds.

The above ethylenically unsaturated organic compounds or monomers may be used alone or in admixture in order to vary the physical properties such as molecular weight, hardness, etc. of the final polymer. Thus, it is well established that the physical properties of a vinyl polymer can be varied by polymerizing in the presence of a small amount of an unsaturated compound containing at least two terminal vinyl groups, each linked to a carbon atom in a straight chain or in a ring. The function of such compounds is to cross-link the polyvinyl chains. Among such cross-linking agents, one can include N,N′-methylenebisacrylamide, triallyl cyanurate, divinyl benzene, divinyl ketones and diglycol diacrylate. Generally speaking, increasing the quantity of cross-linking agent increases the hardness of polymer obtained in the range wherein the ratio of monomer to cross-linking agent varies from 10:1 to 50:1 by weight. The preferred polymerizable composition is a mixture of acrylamide and N,N′-methylenebisacrylamide.

The ferric compounds applicable in the process of the instant invention are those ferric compounds which are radiation-sensitive. Preferred types of radiation-sensitive catalysts for practicing the invention are light-sensitive ferric salts of the type commonly employed in the Blueprint Process. Examples of light-sensitive ferric salts which have been found to be particularly advantageous include ferric ammonium citrate, ferric ammonium oxalate, ferric ammonium tartrate, ferric citrate, ferric potassium citrate, ferric potassium tartrate, ferric sodium oxalate, ferric oxalate, ferric lactate, ferric glyoxylate, ferric malate, ferric glycollate and the like.

The quantity of ferric salts used to initiate polymerization of the ethylenically unsaturated organic monomer is not critical and may be varied over wide limits. Satisfactory results are obtained if the proportion of ferric salt to monomer varies from 1:10,000 to 1:6 parts by weight.

The colloidal carriers employed in the instant process are the conventional carriers and include gelatin, casein, glue, starch, polyvinyl alcohol, cellulose acetate, carboxymethyl cellulose and the like.

The per compounds which are applicable in the instant process as a source of free radicals can include hydroperoxides such as hydrogen peroxide, aliphatic hydroperoxides, i.e., methyl hydroperoxide, ethyl hydroperoxide, tertiary butyl hydroperoxide, hexylhydroperoxide, octyl hydroperoxide, transdecalin hydroperoxide, 1-methylcyclopentyl hydroperoxide, 1,1-dimethyl-2-propenyl hydroperoxide, 2-cyclohexene-1-yl hydroperoxide, cumene hydroperoxide, tetralin hydroperoxide, triphenylmethyl hydroperoxide, etc.; peroxides of the formula ROOR′ wherein R and R′ may be or may not be alike and can be alkyls such as methyl, ethyl, propyl, butyl, pentyl, hexyl, heptyl, octyl, nonyl, decyl, undecyl, etc.; aralkyl, i.e., benzyl, phenylpropyl, naphthylmethyl, naphthyethyl naphthylpropyl, etc.; aryls such as phenylnaphthyl, etc.; aliphatic acyls such as acetyl, propionyl, butyryl, valeryl, etc.; aromatic acyls such as benzoyl, naphthoyl, etc.; peroxy acids such as aliphatic peroxy acids, e.g. peracetic acid, perpropionic acids, perbutyric acids; aromatic peroxy acids, i.e., perbenzoic acids, perphthalic acids, etc.; esters of the aforesaid peroxy acids, salts of peroxy acids such as ammonium persulfate, etc. Such per compounds are well known in the art and their description and preparation can be found in the chemical literature.

It is to be understood that any alpha-hydroxy carboxylic acid is operable in the novel process of this invention with the color of the resulting photoresist being obviously governed by the particular acid added. The light-sensitivity of the alpha-hydroxy carboxylic acid stems from the $$-\overset{|}{C}(OH)COOH$$

group and not on the particular substituents attached to the alpha-carbon atom. The only effect of the specific substituents is on the color and not on operability.

The preferred alpha-hydroxy carboxylic acids correspond to the formula,

R'R''C(OH)COOH wherein R' and R'' individually represent hydrogen, alkyl of from one to 30 carbon atoms, carboxyalkyl, carboxyhydroxyalkyl and aromatic radicals. Examples of acids which can be employed include citric, tartaric, lactic, mandelic, malic, and the like.

As has been previously pointed out, the process of this invention can be carried out in two ways.

The alpha-hydroxy carboxylic acid incorporated into the photopolymerizable composition need not be a dyestuff itself but can be a color coupler, e.g., metahydroxy mandelic acid. Colored photoresists can be produced using acids of this type by incorporating a carboxylic acid capable of acting as a color coupler into the photopolymerizable layer consisting of a water-soluble colloidal carrier, a ferric compound, at least one ethylenically unsaturated compound, and a peroxy compound, exposing through an image-bearing transparency and then developing with a primary aromatic amino developer in the presence of an additional oxidizing agent such as a ferricyanide or a dichromate to oxidize the color developer. While not wishing to be bound by any theory of operation, it would appear that an appropriately substituted carboxylic acid couples with the oxidation products of the primary aromatic amino developer to produce a colored image.

The primary aromatic amino developers are well known in the color photography art and the most common ones are substituted para-phenylene diamines such as N-diethyl para-phenylene diamine, N-dimethyl para-phenylene diamine, and the like.

The ferricyanides or dichromates employed to oxidize the primary aromatic amino color developer are also well known in the art and the most commonly employed ones are potassium ferricyanide and potassium dichromate.

The amount of alpha-hydroxy carboxylic acid added to the polymerizable composition is far from being critical and can vary over a wide range, depending on the color intensity desired. Thus, amounts of from 1 to 50 percent by weight of the polymerizable monomer or monomers are operable.

On the other hand, the alpha-hydroxy carboxylic acid added to the polymerizable composition can be in and of itself, a dyestuff so that after exposure and washing according to conventional techniques, a colored photoresist will result. Acids of this type can be alpha-hydroxy derivatives of well known dyes such as malachite green.

In another embodiment of this invention, it has been discovered that it is not necessary to incorporate the peroxy compound directly into the photopolymerizable layer. Thus, a colored photoresist can be prepared by coating a photopolymerizable layer consisting of a water-soluble colloidal carrier, an ethylenically unsaturated compound, a ferric compound, an alpha-hydroxy carboxylic acid onto a suitable support, exposing to light and then subsequently treating with the peroxy compound, either alone or in mixture with the color developer and dichromate or ferricyanide.

It is also to be understood that numerous materials are suitable for supports or bases for the photopolymerizable composition and the support is of absolutely no criticality. Examples of supports which can be employed include metal, such as aluminum or zinc, terephthalic acid ester polymers, paper, glass, wood, cellulose esters, etc.

The following examples will illustrate the novel process of this invention but it is not intended that it be limited thereto.

EXAMPLE 1

Metahydroxy mandelic acid (0.5 g.) was added to a coating formulation consisting of:

| | |
|---|---|
| Gelatin | 5.0 grams |
| Water | 40.0 milliliters |
| 180 grams acrylamide<br>7.8 grams N,N'methylenebisacrylamide<br>120 grams water | 6.0 milliliters |
| Ferric ammonium citrate<br>(36 grams per 100 ml. water) | 5.0 milliliters |
| Glycerine | 0.5 milliliters |

The above formulation was coated on baryta paper and dried and then treated in the following manner:

A. Exposed through a negative to a 375 watt reflector lamp for three seconds at a distance of 16 inches.

B. Soaked in a 1% solution of hydrogen peroxide for ten seconds.

C. Washed with water at 40° C. to remove unexposed areas.

D. Immersed for 30 seconds in a solution of:

| | |
|---|---|
| Sodium carbonate | 1.0 gram |
| Water | 50 milliliters |
| N-ethyl, N-hydroxy-ethyl para-phenylene diamine | 0.5 gram |

E. Washed with water at 40° C. for 1 minute.

F. Treated with a solution of 0.5 gram of potassium ferricyanide in 50 milliliters of water.

The resulting photoresist was of good quality and had a deep blue color.

EXAMPLE 2

The procedure of example 1 was repeated except that potassium dichromate was used as an oxidizing agent in place of potassium ferricyanide.

The resulting photoresist was now colored green.

EXAMPLE 3

An alpha-hydroxy acid derivative of malachite green having the following formula:

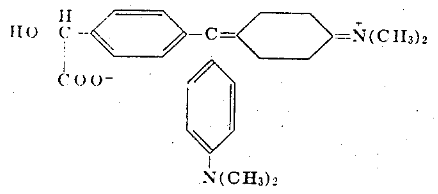

The structure above was prepared by formylating malachite green with a suitable formylating agent such as N-methyl formanilide to give p-formyl malachite green by a reaction such as the following:

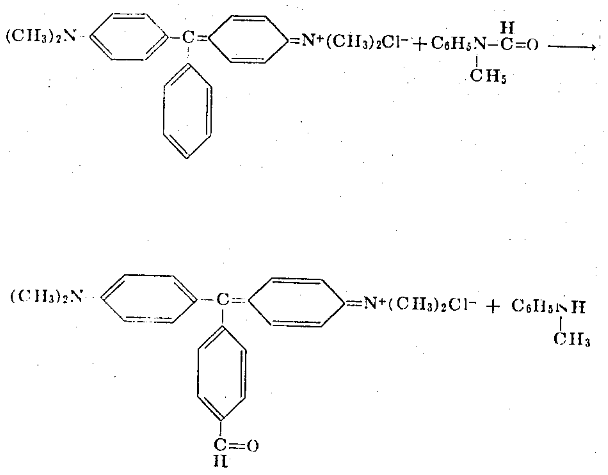

The formyl derivative of malachite green was then converted (by means of the cyanhydrin reaction followed by hydrolysis) to an alpha hydroxycarboxylic acid.

The above acid (0.5 g.) was added to a coating composition consisting of:

| | |
|---|---|
| Gelatin | 5.0 grams |
| Water | 40.0 milliliters |
| 180 grams acrylamide ) <br> 7.8 grams N,N'-methylenebisacrylamide) <br> 120 grams water ) | 6.0 milliliters |
| Ferric ammonium citrate (36 grams per 100 milliliters water) | 5.0 milliliters |
| Glycerine | 0.5 milliliter |

The resulting formulation was coated on paper and exposed to a 375 watt reflector lamp through a negative for 3 seconds at a distance of 16 inches. After exposure, the coated paper was treated with a 1% hydrogen peroxide solution for ten seconds and then washed with water.

The resulting photoresist was of good quality and had a green color.

The resulting photoresist was of good quality and had a green color.

Various modifications of the invention will occur to persons skilled in the art and it is not intended that the invention be limited except as necessitated by the appended claims.

I claim:

1. A photopolymerizable composition comprising at least one ethylenically unsaturated compound, a light-sensitive ferric salt, and an alpha-hydroxy carboxylic acid selected from the group consisting of color couplers which yield a coloration with the oxidation products of a primary aromatic amine developer and alpha-hydroxy-carboxy-substituted dyestuffs.

2. A photopolymerizable composition according to claim 1 wherein a water-soluble colloidal carrier is added to said photopolymerizable composition.

3. A photopolymerizable composition according to claim 2 wherein said colloidal carrier is gelatin.

4. A photopolymerizable composition according to claim 3 consisting essentially of gelatin, metahydroxy mandelic acid, acrylamide, N,N'-methylene-bisacrylamide and ferric ammonium citrate.

5. A photopolymerizable composition according to claim 3 consisting essentially of gelatin, hydroxy-carboxy-methyl-substituted malachite green, acrylamide, N,N'-methylene-bisacrylamide and ferric ammonium citrate.

6. In the process for preparing photoresists wherein a photopolymerizable composition comprising a water-soluble colloidal carrier, at least one ethylenically unsaturated monomer and a light-sensitive ferric salt is coated on a suitable support, dried, imagewise exposed to light, and then developed by washing in the presence of a peroxy compound, the improvement which comprises adding an alpha-hydroxy carboxylic acid selected from the group consisting of color couplers which yield a coloration with the oxidation products of a primary aromatic amine developer and alpha-hydroxy-carboxy-substituted dyestuffs to said photopolymerizable composition prior to exposure.

7. The process of claim 6 wherein the alpha-hydroxy carboxylic acid is a dye.

8. The process of claim 6 wherein the alpha-hydroxy carboxylic acid is a color coupler.

9. A photopolymerizable composition according to claim 1 containing a peroxy compound.

10. The process of preparing a colored photoresist which comprises image-wise exposing to light, a photopolymerizable layer on a support, said layer consisting essentially of a water-soluble colloidal carrier, at least one ethylenically unsaturated monomer, a light-sensitive ferric salt and an alpha-hydroxycarboxylic acid which is a color coupler yielding a coloration with the oxidation products of a primary aromatic amine developer, treating said layer with a peroxy compound, developing it with a primary aromatic amino developer solution, and treating it with the solution of an oxidizing agent selected from the group consisting of water-soluble ferricyanides and dichromates.

11. The process of preparing a colored photoresist according to claim 10 wherein said layer consists essentially of meta-hydroxy mandelic acid, gelatin, acrylamide, N,N'-methylenebisacrylamide and ferric ammonium citrate, said peroxy compound is hydrogen peroxide and said primary aromatic amino developer is n-ethyl-N- para-phenylenediamine 12. The process of preparing a colored photoresist which comprises image-wise exposing to light, a photopolymerizable layer on a support, said layer consisting essentially of a water-soluble colloidal carrier, at least one ethylenically unsaturated monomer, a light-sensitive ferric salt and an alpha-hydroxy-carboxy-substituted dyestuff, treating said layer with a peroxy compound and developing by washing with water.

13. The process of preparing a colored photoresist according to claim 12 wherein said layer consists essentially of gelatin, acrylamide, N,N'-methylenebisacrylamide, ferric ammonium citrate and hydroxy-carboxy-substituted malachite green, treating said layer with hydrogen peroxide, and developing by washing with water.

* * * * *